United States Patent [19]

Furlan

[11] Patent Number: 5,210,536
[45] Date of Patent: May 11, 1993

[54] DATA COMPRESSION/CODING METHOD AND DEVICE FOR IMPLEMENTING SAID METHOD

[75] Inventor: Gilbert Furlan, San Jose, Calif.

[73] Assignee: International Business Machines Corp., Armonk, N.Y.

[21] Appl. No.: 741,372

[22] Filed: Aug. 7, 1991

[30] Foreign Application Priority Data

Oct. 9, 1990 [EP] European Pat. Off. ........ 90480158.6

[51] Int. Cl.$^5$ .............................................. H03M 7/30
[52] U.S. Cl. ..................................... 341/107; 341/87; 341/51
[58] Field of Search ........................ 341/51, 63, 87, 95, 341/106, 107

[56] References Cited

U.S. PATENT DOCUMENTS

| 4,494,108 | 1/1985 | Langdon, Jr. et al. |
| 4,652,856 | 3/1987 | Mohiuddin et al. |
| 4,719,571 | 1/1988 | Rissanen et al. ..................... 364/300 |
| 5,023,611 | 6/1991 | Chamzas et al. ..................... 341/51 |
| 5,025,258 | 6/1991 | Duttweiler ............................ 341/107 |

FOREIGN PATENT DOCUMENTS 0245621 11/1987 European Pat. Off.

OTHER PUBLICATIONS

IEE Transactions on Communications, vol. 37, No. 4, Apr. 1989, pp. 317-324, New York, T. Ramabadran et al., "An Adaptive Algorithm for the Compression of Computer Data".

IBM Technical Disclosure Bulletin, vol. 25, No. 5, Oct. 1982, pp. 2462-2464, Armonk, N.Y., J. Rissanen, "Adaptive Context Generation for Data Compression".

Communications of the Association for Computing Machinery, vol. 30, No. 6, Jun. 1987, pp. 520-540, New York, H. Witten et al., "Arithmetic Coding for Data Compression".

*Primary Examiner*—Howard L. Williams
*Attorney, Agent, or Firm*—Edward H. Duffield

[57] ABSTRACT

A device for adaptively encoding a flow of data symbols $x_1, x_2, \ldots, x_t$ taken within a predefined symbol family, into a compressed bit string c(s), said method including so-called modelling operations (see Modelling Unit 60) whereby the numbers of times each symbol occurs in the flow are collected in a tree architecture denoting past flow symbols considered in a predefined order according to a reordering function f(t), and Relative Efficiency Counter (REC) facilities embedded in the growing tree nodes, and tracking REC variations for both optimal coding node determination and tree updating operations. The compressed bit string is then generated by an Arithmetic Coder (64) connected to said Modelling Unit (60).

16 Claims, 13 Drawing Sheets

TRANSINIT Function

TRANSINIT Function

CODING SCHEDULER

TMM function
(transmitter model manager)

Create node $Z_m$ function
(transmit)

TTRANS function

CODING MODELLING UNIT $n'(Z)$ = sum of the counters $n'(a_i/Z)$
$Q(x_t)$ = cumulative count $n'(1/Z)+...+n'(x_t-1/Z)$
$Q(d)$ = cumulative count $n'(1/Z)+...+n'(d-1/Z)$

RECEIVINIT Function

DECODING SCHEDULER

RCNR function

RINCD function

RMM function

Create node $Z_m$ function

DATA COMPRESSION/CODING METHOD AND DEVICE FOR IMPLEMENTING SAID METHOD

FIELD OF THE INVENTION

The invention deals with an improved coding method and device for data compression.

BACKGROUND OF THE INVENTION

It is needless to mention how fast new data processing applications are being requested throughout the world. This implies an increase in data communications and storage requirements and correlative traffic jamming and memory saturations.

One solution to those problems is provided by technical means for minimizinq the bit rates required to diqitally express (encode) the processed data while keeping the encoded data quality optimal to the user.

For that purpose, means for compressing the bit rates required for digitally encoding any kind of data are being eagerly looked for.

More generally speaking, let $x(t) = x_1, x_2, \ldots, x_t$, be a string or flow of symbols (symbol being herein taken in a fairly broad sense to include printed characters, image pixels etc . . .), wherein $x_t$ is the current symbol and $x_1, x_2$ are past symbols all taken within a predefined family of symbols $A = (a_1, a_2, \ldots, a_d)$ including a predefined number (d) of different symbols.

Efficient methods have been provided for sequentially coding said string of synbols. For instance, one may refer to U.S. Pat. No. 4,652,856 wherein the flow of symbols is sequentially processed within a Modelling Unit (12) feeding an Encoding Unit (14) to achieve data compression (see FIG. 1 of the above cited US reference).

A particularly valuable Encoding Unit based on arithmetic coding theory is fully described in the above mentioned US Patent.

However, efficient modelling is obviously a critical feature within the overall coding process. To achieve such a modelling, a so called "context" dependent method has been proposed by J. Rissanen in the IBM Technical Disclosure Bulletin Vol. 25 N° Oct. 5, 1991 pp 2462-2464. To that end, the coding of any current symbol $x_t$ takes into consideration hoth past symbols within the considered string, and a so called "influence", or rather relative influence, of past symbols over current symbol coding. The context is defined according to a reordering of past symbols thought to have "influence" on current symbol, with the most influencing symbol considered first, then considering the next to most influencing, and so on.

Rissanen's method collects in a "tree" the number of times or "counts" each symbol of the string being processed occurs at various contexts or states. Modelling operations involve growing the tree in correlation with the consecutive symbols occurrences within the string by assigning each tree "node" with count facilities, taking also into consideration the mentioned influence criteria.

ln Rissanen's method, however, the context tree grows beyond any bound as the tree grows, and so does the required storage for implementing the method. Obviously, this is a main drawback to any actual implementation of said method or process from a practical standpoint.

OBJECTS OF THE INVENTION

One object of this invention is to substantially simplify the algorithm, and therefore the method, for implementing the above mentioned modelling operations to enable reducing the required modelling storage to a level which depends upon the properties of the string but not on the string length.

BRIEF SUMMARY OF THE INVENTION

This is accomplished based on the concept of stochastic complexity and its use to determine the optimal tree for each symbol in the string. Stochastic complexity generalizes Shannon's data complexity which is defined as the negative logarithm of a probability distribution "p" evaluated at the considered data string.

The generalization consists in adding to Shannon's information, a term reflecting the complexity of the task required to estimate the distribution needed in the Shannon information.

Using this method, one can, in the context tree, select that node as the optimal context which gives the smallest expected coding length to the next (i.e. currently considered) symbol.

To that end, this invention modifies Rissanen's method by providing so called Relative Efficiency Counter (REC) facilities. More importantly, by embedding said counter facilities in the tree growing algorithm and by considering REC variations while updatinq and growing the tree, the mentioned storage limiting improvement is achieved.

The foregoing and other objects features, and advantages of the invention will be apparent from the more particular description of the preferred embodiments of the invention, as illustrated in the accompanying drawings.

DESCRIPTION OF PREFERRED EMBODIMENTS OF THE INVENTION

Figure 1:
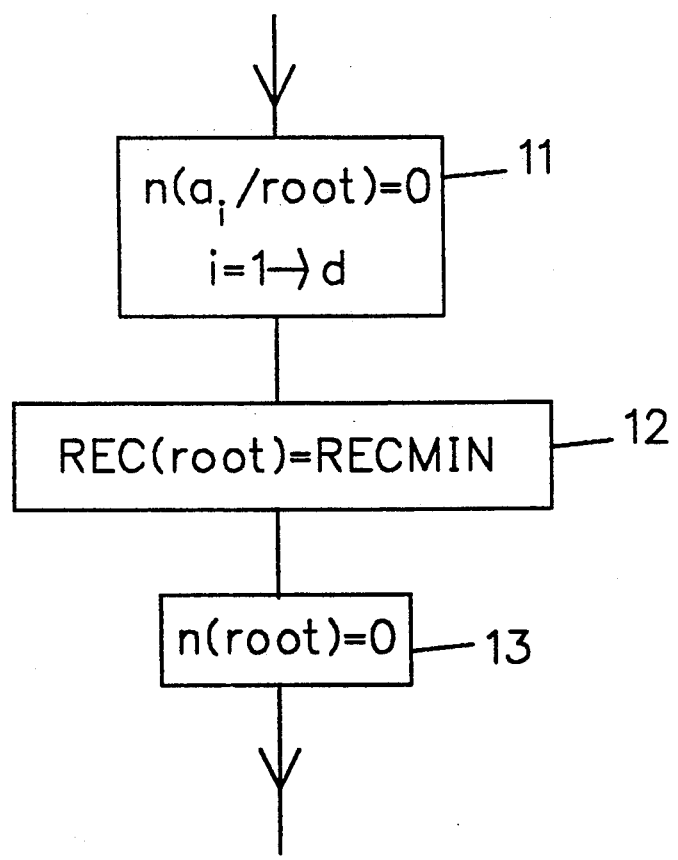
FIGS. 1-5 are flowcharts for implementing the Modelling Operations for an encoding process.

As already mentioned, the term "symbol" should be considered in a fairly broad sense, to include printed characters imaqe pixels, voice samples. sub-band references in a split-band coder etc . . . In addition, let $$z1 = x_{t-f(1)}, z2 = x_{t-f(2)}; \ldots; \ldots$$

$$1 \leq f(k) \leq t-1 \text{ and } k = 1, \ldots, t-1$$

The context criteria is defined according to said reordering context function f(t) considering the past symbols thought to have most "influence" on the current symbol. Accordingly, z1 is selected for having the greatest influence on current symbol $x_t$, then comes $z_2, z_3, \ldots$, and so on. For example, for a string of printed characters, f would be the identity function, so that $z1 = x_{t-1}, z2 = x_{t-2}$, etc ...

For a string of symbols representing image pixels, each symbol may be defined assuming Cartesian coordinates (i,j), with i being the image row index and j the column index. Then $x_t = x(i,j)$.

Assume the considered image be top-down scanned row-by-row, each row including m pixels. Let the pixels be represented as follows for a 2 dimensional picture.

$$\begin{array}{ll} \gamma & \beta \\ x_{t-m-1} = x(i-1, j-1) & x_{t-m} = x(i-1, j) \\ \alpha & \\ x_{t-1} = x(i, j-1) & x_t = x(i, j) \end{array}$$

A context to current pixel $x_t$ may be defined by $\alpha, \beta, \gamma$, in which case the function $f$ would provide $f(1)=1$; $f(2)=m$; $f(3)m+1$.

$$z1 = z_1^1 = x_{t-1} = x(i, j-1)$$
$$z2 = z_2^1 = x_{t-m} = x(i-1, j)$$
$$z3 = z_3^1 = x_{t-m-1} = x(i-1, j-1)$$

The same current pixel may also be defined with a different context i.e. $\beta, \alpha, \gamma$. Then $f(1)=m$; $f(2)=1$ and $f(3)=m+1$, in which case, $$z1 = z_1^2 = x_{t-m} = x(i-1, j)$$
$$z2 = z_2^2 = x_{t-1} = x(i, j-1)$$
$$z3 = z_3^2 = x_{t-m-1} = x(i-1, j-1)$$

(Note: for images, the symbol family may represent "d" predefined levels of grey or "d" predefined colors, for instance).

In both above cases however, z1 would be considered the "closest" or most "influencing" symbol of the context$_t$, then comes $z_2, z_3$, etc ...

In other words, in a string of printed characters, the context is defined by past symbols taken sequentially, starting with the closest to current symbol, while in a picture, the pixel context is defined by past symbols considered in a predefined order, not necessarily sequentially considered as scanned.

Obviously, the above considerations may apply to any kind of symbols, including voice samples, sub-band locations in a split-band coder, multidimensional pictures, colors, etc ...

In practice, given a string of symbols, one will consider sequentially the consecutive symbols for coding purposes and grow the tree progressively to perform the Modelling Operations.

Said Modelling Operations within the coding/compression process will include, for each considered symbol:

choosing an optimal coding mode within the current tree growing progressively in conjunction with the successive symbol processing ;
arithmetic encoding the current symbol by feeding an arithmetic encoder as described in the above cited U.S. patent reference, with the required parameters as defined in said reference. and based on the actual tree;
updating and developing the tree structure.

Correlative decoding of the bit string provided by the arithmetic encoder, back into the original string of symbols will include similar tree based operations involving selecting an optimal node, feeding an arithmetic decoder with the required parameters derived from the actual tree structure, and updating and developing the tree as required.

The invention will now be described with reference to detailed flowcharts which would easily be implemented into programs to be used into a signal processor for implementing the invention.

Represented in FIG. 1 is a flow chart labeled TRANSINIT Function for implementing the coding process. The tree building-up starts with a basic original node (root node) provided with a counter facility for each symbol in the considered symbol family including "d" symbols. All root counters, i.e. $n(a_i/root)$ for $i=1$ through d, are initially reset to zero (11). The root Relative Efficiency Counter is set to a predefined minimal value RECMIN (12) to assign said root node a predominant function in the process. Also, a specific count (n(root)) representing the sum of all $n(a_i/root)$ counters is set to zero (13).

Figure 2:
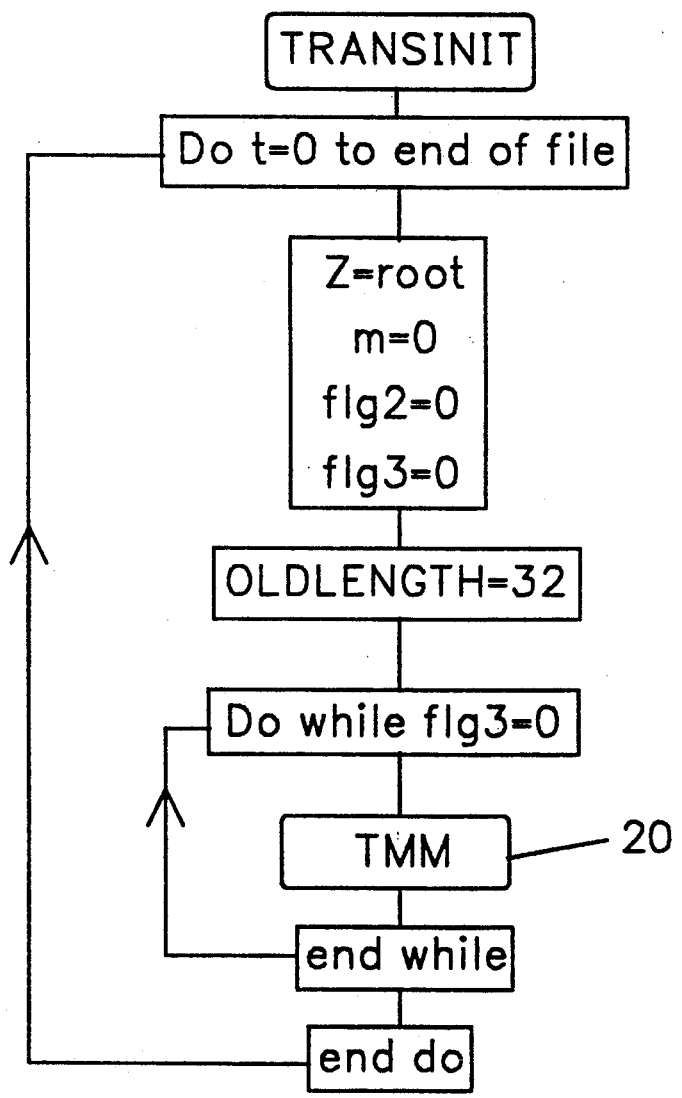
Figure 3:
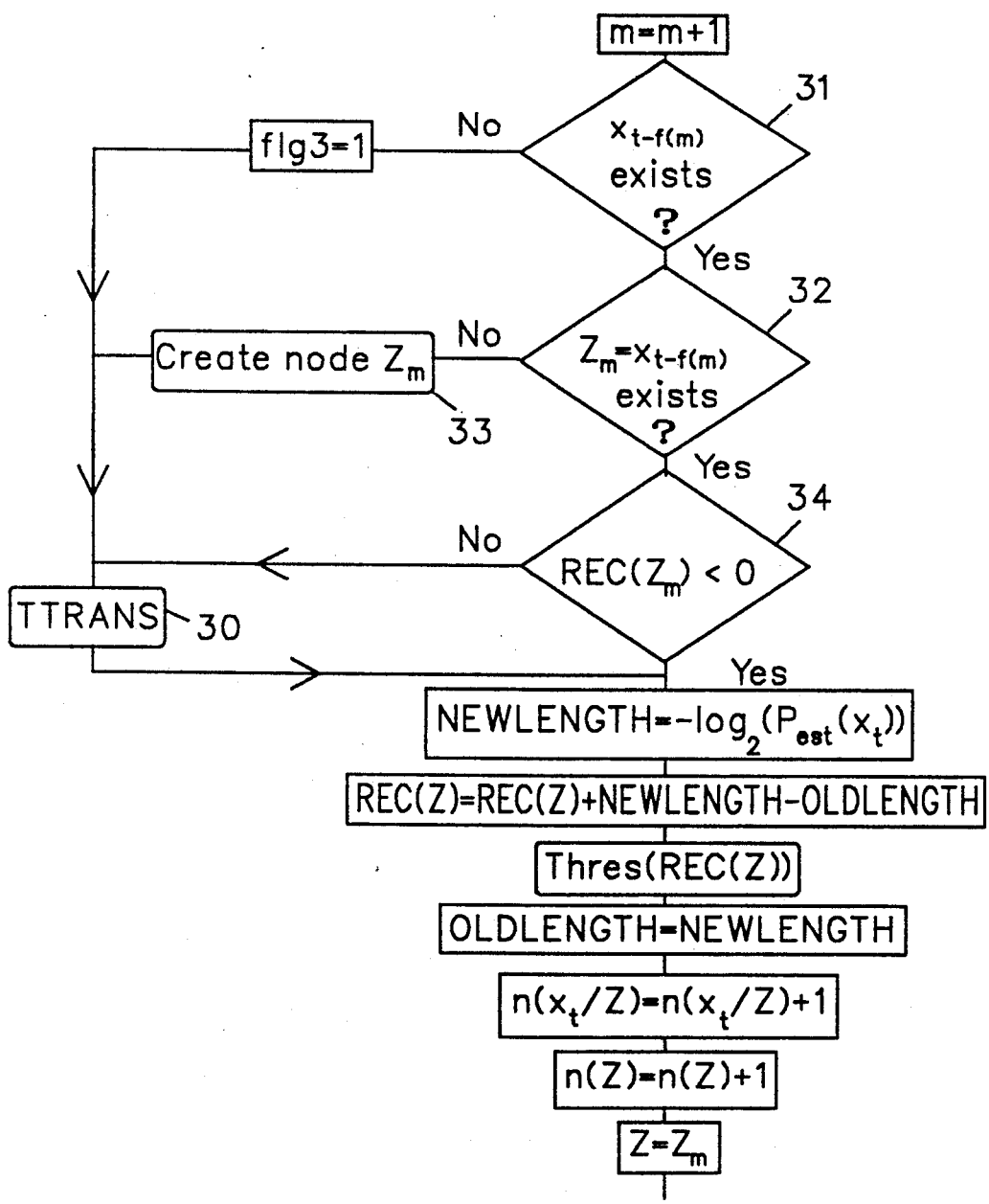

The data coding may now proceed according to the SCHEDULER flow chart of FIG. 2, starting with first symbol in the considered flow or string. Letting Z designate the currently considered node reference, start with the root, i.e. Z=root, and set a processing parameter m to zero. Similarly, two processing flags, flg2 and flg3 are set to zero. As will be described later, the tree processing is based on REC variations considerations. To that end, so called "LENGTH" counters are provided, with a predefined value. A recursive process may now start to perform Model Management functions including the coding node choice, tree updating and development operations based on the algorithm labeled TMM (20) as represented in FIG. 3.

The processing parameter m initially set to zero is incremented by 1. Fist test (31) checks for the existence of a possible past symbol to begin to build the context of the current symbol, starting with $x_{t-f(1)}$. In case of negative test, a flag, i.e. flg3 is set to one and the system branches to arithmetic encoding operations as represented by the TTRANS (30) flow chart, before proceeding further.

Assuming, on the contrary, a positive test be obtained for step (31), then the process switches to next test, or node existence test (32). In other words, a node $Z(1)=x_{t-f(1)}$ is being looked for.

Assuming a negative test (32), a node creation algorithm (33) is performed to achieve tree updating and development operations and then switch to the TTRANS operations controlling Arithmetic Encoding operations. Otherwise, if test (32) is positive, the system switches to a REC (Zm) evolution test (34). One should note herein that, in this description, "REC" will be used to designate both a counter and its contents. Various alternatives may be used to perform the evolution test. For instance, one may consider testing the REC derivative sign. However, the bulk of the process would then lie with the fact that the derivative computations and correlative storage requirements would not be optimal from a practical standpoint. This is why a preferred embodiment has been implemented which is based on REC thresholding operations denoting REC evolution without the hassle of derivative computations.

Should test (34) be negative the process branches to TTRANS function. Otherwise, the system proceeds further with REC processing.

To help understand the rationale of the coding node choice and tree updating, one must note the following: choosing a coding node for the current symbol xt involves climbing the tree starting from the root node and finding a path based on the context. Let $Z(i) = Z(1), Z(2), \ldots,$ be a path via nodes $Z(1), Z(2), \ldots$ Said path leads to an optimal (coding) node defining a possible context for the current symbol $x_t$, said optimal node being the first visited node, on said path, bearing a decreasing REC and preceding a node with an increasing or stable REC. Tree development will be limited to potential extensions from said coding node.

REC evolution tracks the difference of coding length between any visited node and the preceding (father) node. In other words, gradient sign is the criteria.

In practice, for each visited node Z(j) one will compute the entropy $E(x_t/Z(j))$ wherein $x_t$ is the current symbol and :

$$E(x_t/Z(j)) = -\log_2(\text{Pest } x_t)$$

For instance, and as a non-limitative example, one may choose to express Pest (xt) using a Lapiacian $$\text{Pest}(x_t) = \frac{n(x_t/Z(j)) + 1}{n(Z(j)) + d}$$

Wherein $n(x_t/Z(j))$ denotes the count of symbol $x_t$ at the considered node Z(j) ; and $n(Z(j))$ represents the sum of all symbol counts at same node Z(j).

Accordingly, should the answer to test (34) be positive, a NEWLENGTH count assigned to the current node is set to $-\log_2(\text{Pest}(x_t))$ Then, the current node REC counter is updated to:

$$\text{REC}(Z) = \text{REC}(Z) + \text{NEWLENGTH} - \text{OLDLENGTH}$$

Wherein OLDLENGTH would be the Laplacian estimator for previous visited node $Z(j-1)$ or so-called "father" node for present (son) node Z(j), and NEWLENGTH would be the currently computed node Laplacian estimator.

REC(Z) value is thresholded not to develo- beyond a preassigned threshold (Thres). For instance, one may select Thres = ±5 or any other convenient value. More generally stated, should REC(Z) be greater than positive threshold RECMAX, then REC(Z) is set to RECHAX. Otherwise, a negative threshold RECMIN test is performed to limit REC(Z) to RECMIN.

Then, to enable tree development, the current node should lead to a new ("son") node. Accordingly, the current node would be considered a "father" node.

Therefore, OLDLENGTH count is set to the just computed NEWLENGTH value.

In addition, corresponding tree updating should be achieved by incrementing both the specific $x_t$ count, $(n(x_t/Z))$, and the node count, $(n(Z))$, prior to proceeding further to next node processing.

Figure 4:
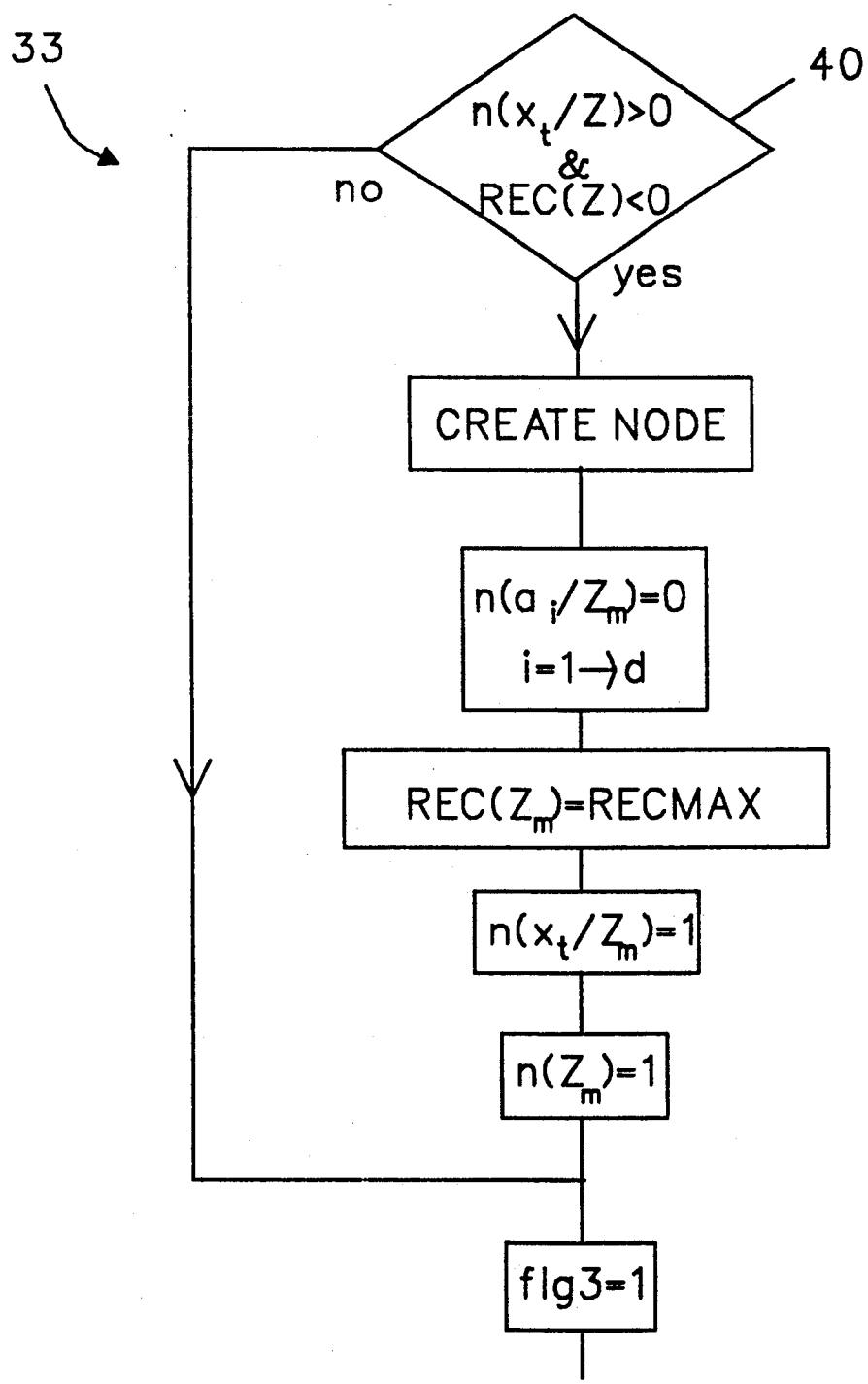

Represented in FIG. 4 is a flowchart for creating a node Zm (33), whenever the test 32 of TMM function failed (i.e. a node $Zm = x_{t-f(m)}$) does not exist within the current tree). As already mentioned, tree extension will be limited to the coding node. In the preferred embodiment, the condition for a visited node being a coding node is summarized by test (40). The process starts with testing both current symbol count sign and thresholded REC sign.

Should the answer to double condition $n(x_t/Z) > 0$ AND REC(Z) < 0 (test 40) not be satisfied, the system switches to TTRANS operations. Otherwise, if answer to test 40 is positive, then a new node is created with all "d" symbol counts initialized to zero and REC counter set to a predefined RECMAX value. The node symbol and total counts are then updated based on the currently processed symbol.

Figure 5:
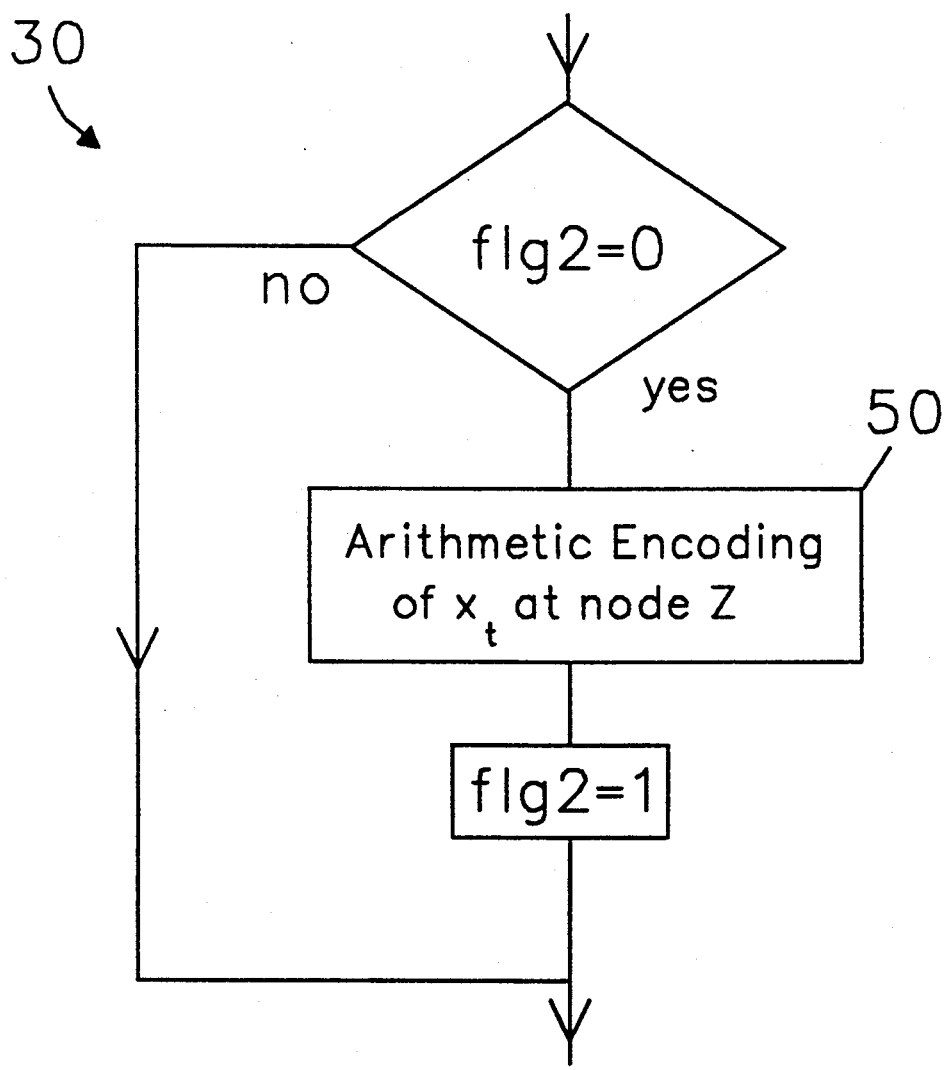

Represented in FIG. 5 is a flowchart for the TTRANS funotion. A flag 2 test is performed to avoid redundant Arithmetic Encoding (50) operations.

Figure 6:
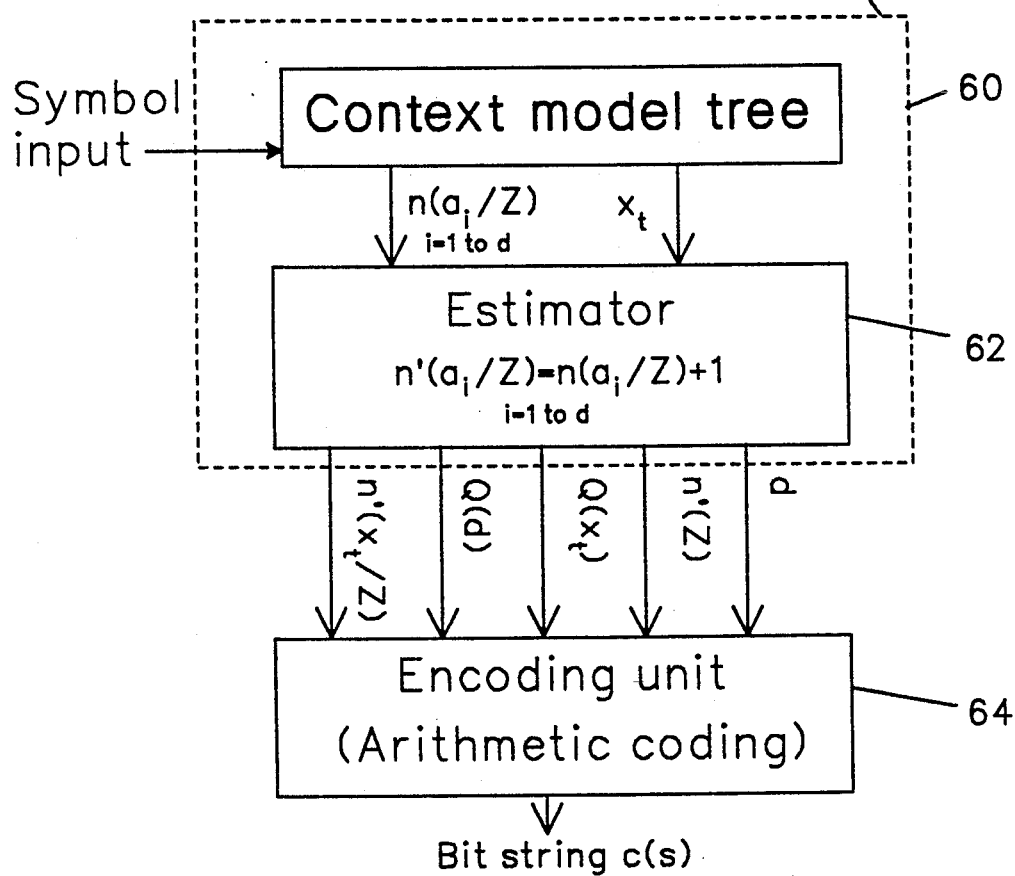
FIG. 6 is a block diagram showing the Coding Modelling Unit and the Arithmetic Coding Unit.

Arithmetic encoding is performed as indicated in U.S. Pat. No. 4,652,856, based on data provided by the Modelling Unit (60), i.e. derived from the actual tree status indicating the tree path visited to get to the selected node while considering current symbol, and the symbol counts within said selected node. To that end (see FIG. 6), the counts of all counters within the selected node (Z), in other words, n(ai/Z) for i=1 to d, have to be provided to the Encoding Unit (64), together with the identification of the current symbol. A so-called Estimator (62) fed with n(ai/Z) and xt computes the parameters required for feeding the Encoding Unit (64). It should be noted that to make the present system plug-to-plug compatible with the Arithmetic Coder (14) described in the above cited U.S. patent, all counts (n(ai/Z) provided by the Modelling Unit of present invention have been added one unit to take into consideration the fact that in this invention the counters had been initially reset to zero. In other words, new counts n' are derived:

$$n'(ai/Z) = n(ai/Z) + 1$$

for i = 1 to d

The parameters computed within the estimator (15) are the so-called total count and cumulative counts, as well as individual count (see the cited US reference):

$$n'(Z) = \sum_{i=1}^{d} n'(ai/Z)$$

$$Z(x_t) = n'(1/Z) + \ldots + n'(x_{t-1}/Z)$$

$$Q(d) = n'(1/Z) + \ldots + n'(d-1/Z)$$

$n'(x_t/Z)$ = the individual count of current symbol $x_t$ at node Z.

Wherein Z is the selected coding node.

Q(d) and Q(x_t) are cumulative counts. The symbols are generally set in a predefined order. For instance printed characters are lexically arranged. However, in order to achieve minimal redundancy to the arithmetic encoding, the symbol which appeared more frequently would be located first. For example, one may have:

| | A | B | D | E | C |
|---|---|---|---|---|---|
| n' = | 3 | 5 | 4 | 1 | 10 |

Therefore, assuming $x_t = E$, then:

$$Q(d) = 3 + 5 + 4 + 1 = 13$$

$$Z(x_t) = 3.30\ 5 + 4 = 12$$

The Estimator also computes the estimated probability distribution. The later operation may, for instance, be based on Laplacian estimation, $$\text{Pest}\ (ai) = \frac{n(ai/Z) + 1}{n(Z) + d}$$

A flag flg2 enables checking whether current symbol $x_t$ has been coded, i.e. TTRANS routine executed.

Given the above described detailed flow charts any programmer will have no difficulty for translating those flow charts into a program in a conventional language fitting to a sPeoifioallY seleoted Prooessor, storing said program into a ROM, and then running this system to perform the Modelling Operations, and driving an Arithmetic Encoder to generate a compressed encoded bit string c(s) as looked for.

Similarly correlative decodinq functions to be used for converting the encoded bit string c(s) back into the corresponding original flow of symbols, will involve also modelling operations.

Figure 7:
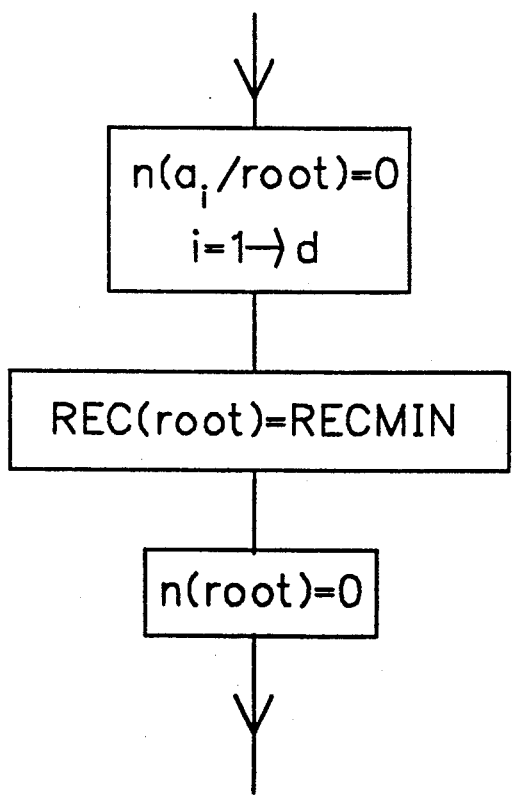
FIGS. 7-9 are flowcharts for implementing the Modelling operations for a decoding process.
Figure 8:
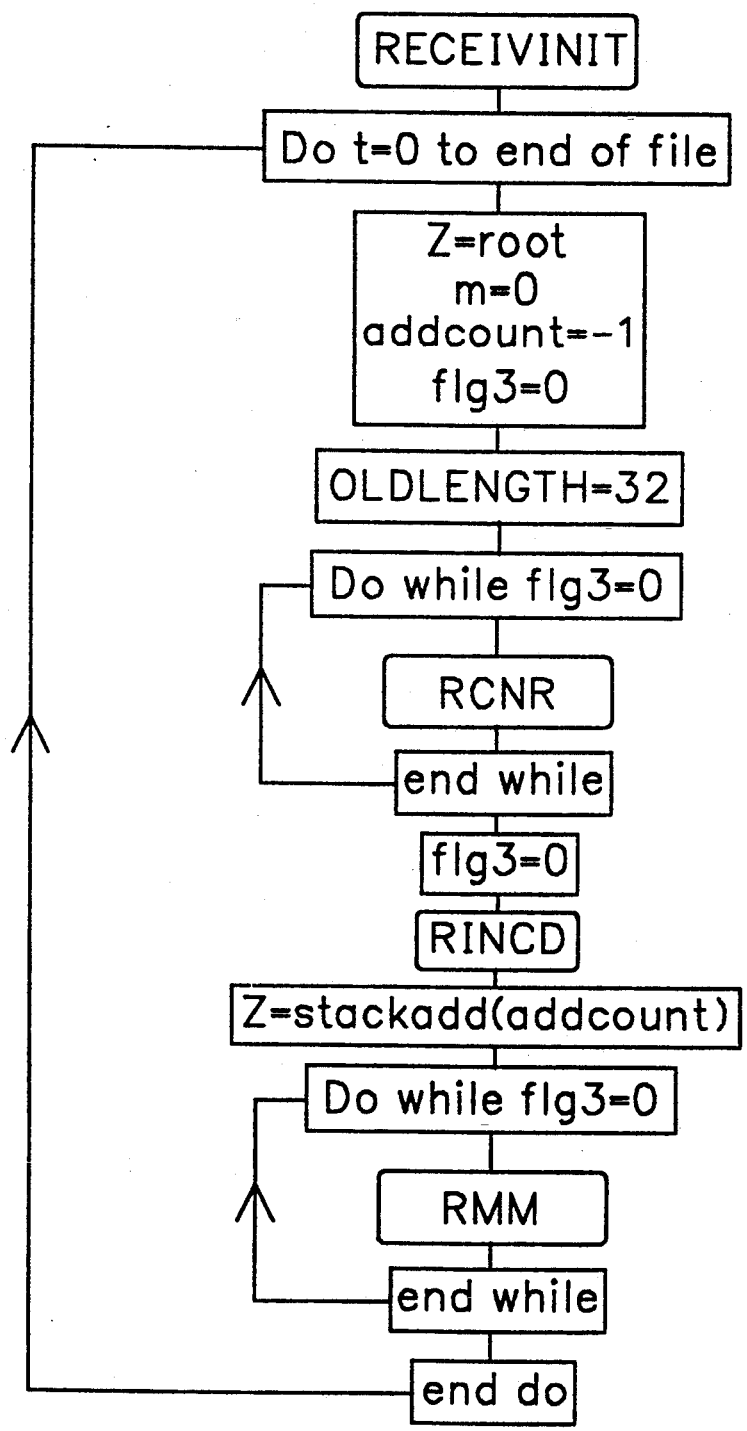

More particularly, once the decoding is initialized as the coding was (see FIG. 7 representing a RECEIVINIT flow chart similar to the TRANSINIT of FIG. 1), the decoding process may proceed according to the Decoding Scheduler of FIG. 8.

The Decoding Scheduler differs from the Coding Scheduler of FIG. 2 in that the various operations for performing the optimal node (i.e.: coding node) search, tree updating, and tree development have been split into RCNR, RINCD and RMM, respectively.

Once the system is initialized, the decoding scheduler starts with setting the node parameter Z to the root, m=0 and the flag flg3=0. Another address counter labelled addcount is set to −1. OLDLENGTH parameter is set to maximum value (32). The RNCR algorithm may then be set running.

Figure 9:
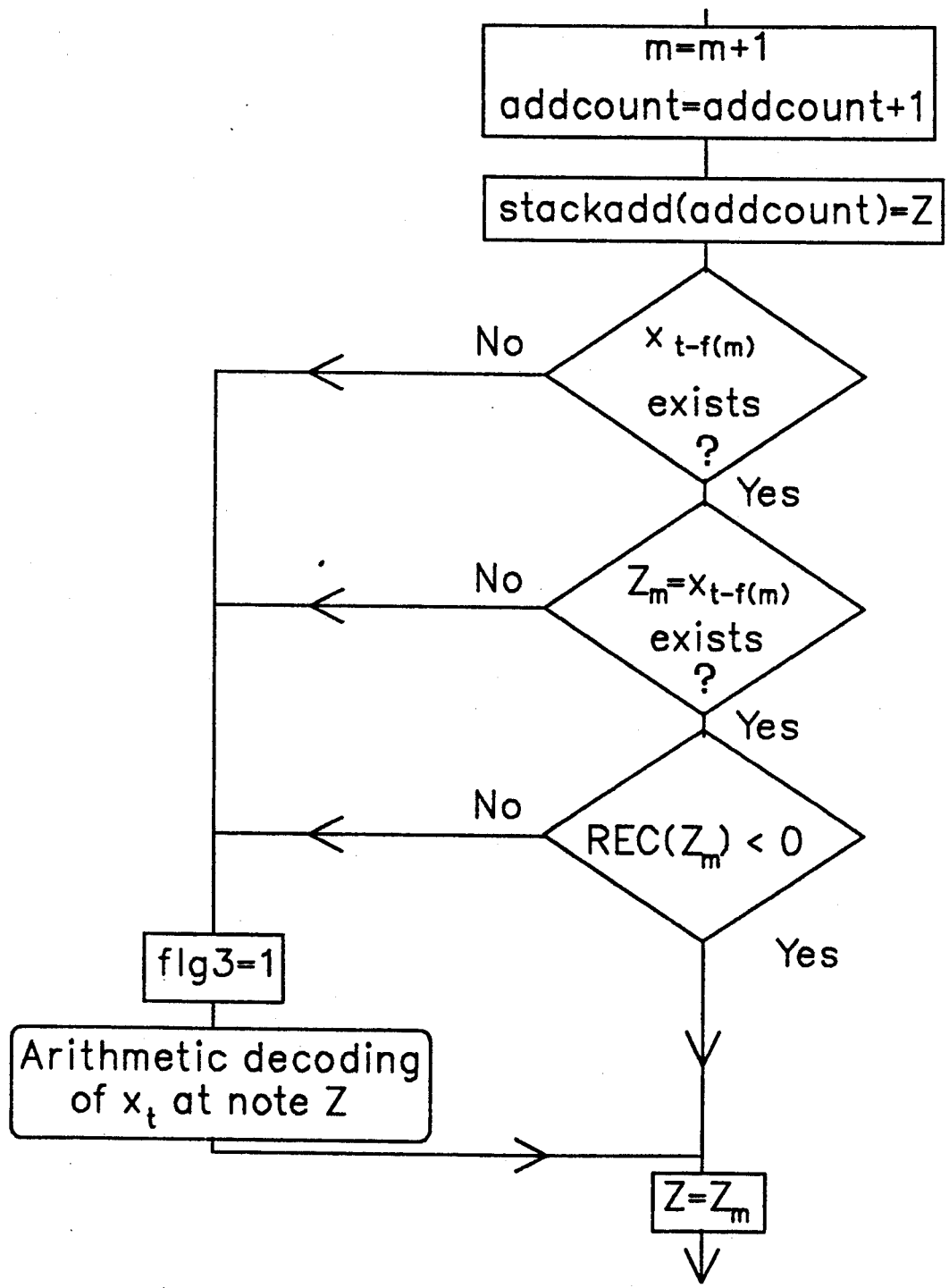

Represented in FIG. 9 is the optimal node search (RCNR) function flow-chart. The parameters m and addcount are incremented. While the optimal decoding node is being looked for, additional register, labelled stackadd(addcount), is used to pile the addresses of visited nodes (Z). The symbol and node existence as well as REC siqn tests (as defined with reference to FIG. 3) are then performed for the currently decoded symbol $x_t$.

Should the answers to these consecutive tests be positive, Z is set to Zm and the system proceeds further with the decoding operations. Otherwise, should the tests be negative, Arithmetic Decoding operations are performed to recover the currently decoded symbol $x_t$ based on the current bit string c(s) status to be decoded.

Figure 10:
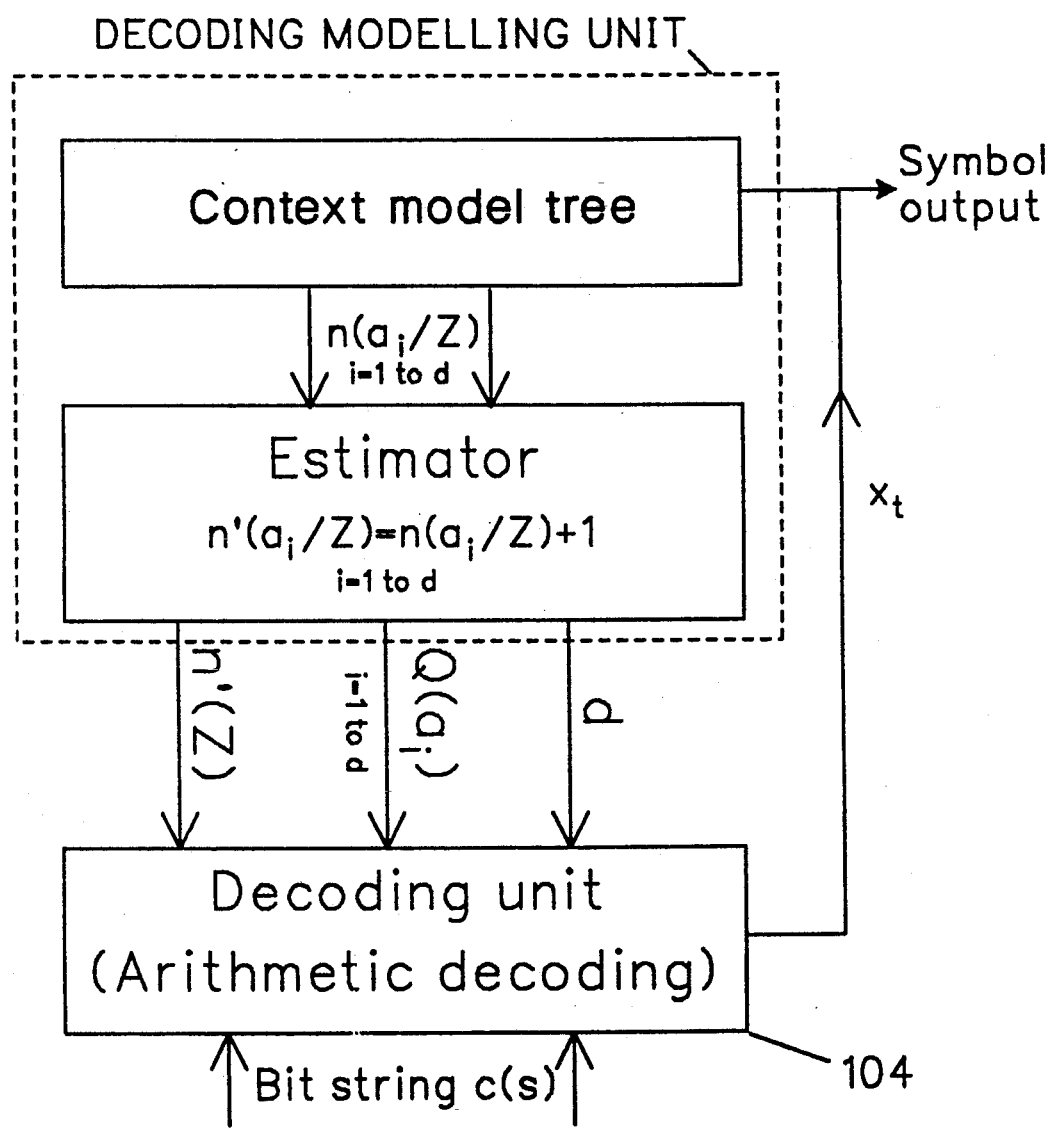
FIG. 10 is a block diagram showing the Decoding Modelling Unit and associated Arithmetic Decoder.

Represented in FIG. 10 is a block diagram showing the Arithmetic Decoding Unit combined with the Modelling Unit of this invention. The bit string c(s) to be decoded into symbols $x_t$ is fed into an Arithmetic Decoding Unit (104) made according to the teaching of the above cited U.S. Pat. No. (4,652,856). Said Unit (104) is also fed with the number of symbols "d", cumulative counts Q(ai) and total counters' contents n'(Z), as provided by the modelling unit as described. One should note here that n'(Z) is qiven same definition it was given with reference to FIG. 6, while Q(ai)=n'(1/Z)+ +n-'(a$_{i-1}$/Z), Z representing the optimal DE (coding) node selected.

Figure 11:
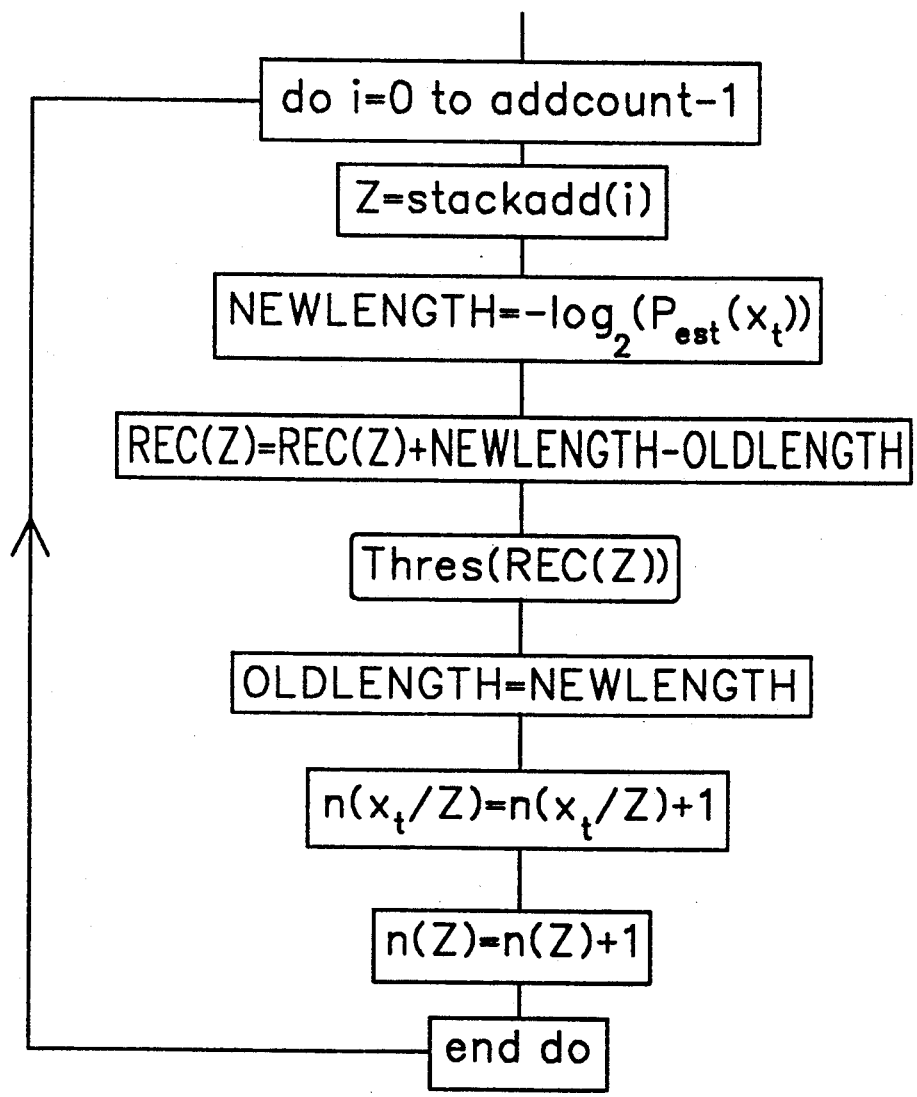
FIG. 11-13 are flow charts for implementing functions involved in the decoding operations according to FIG. 8.

Once the operations for retrieving the current symbol $x_t$ have been performed together with locating the optimal node and memorizing the visited nodes addresses (which condition is checked by testing flg.3). the system proceeds with incrementing the counters of the visited nodes (see RINCD) function of FIG. 11. Said visited node addresses are defined based on the stack of visited node addresses. For each said nodes, a NEWLENGTH value is computed:

NEWLENGTH - log$_2$ (Pest($x_t$))

The REC variation content is updated

REC(Z)=REC(Z)+NEWLENGTH−OLD-LENGTH and then thresholded. Also, as explained with reference to FIG. 3, proceeding further with the tree involves identifying the current node as a "father" node for next node to be considered (i.e. "son" node).

This is achieved by setting:

OLDLENGTH=NEWLENGTH

Figure 12:
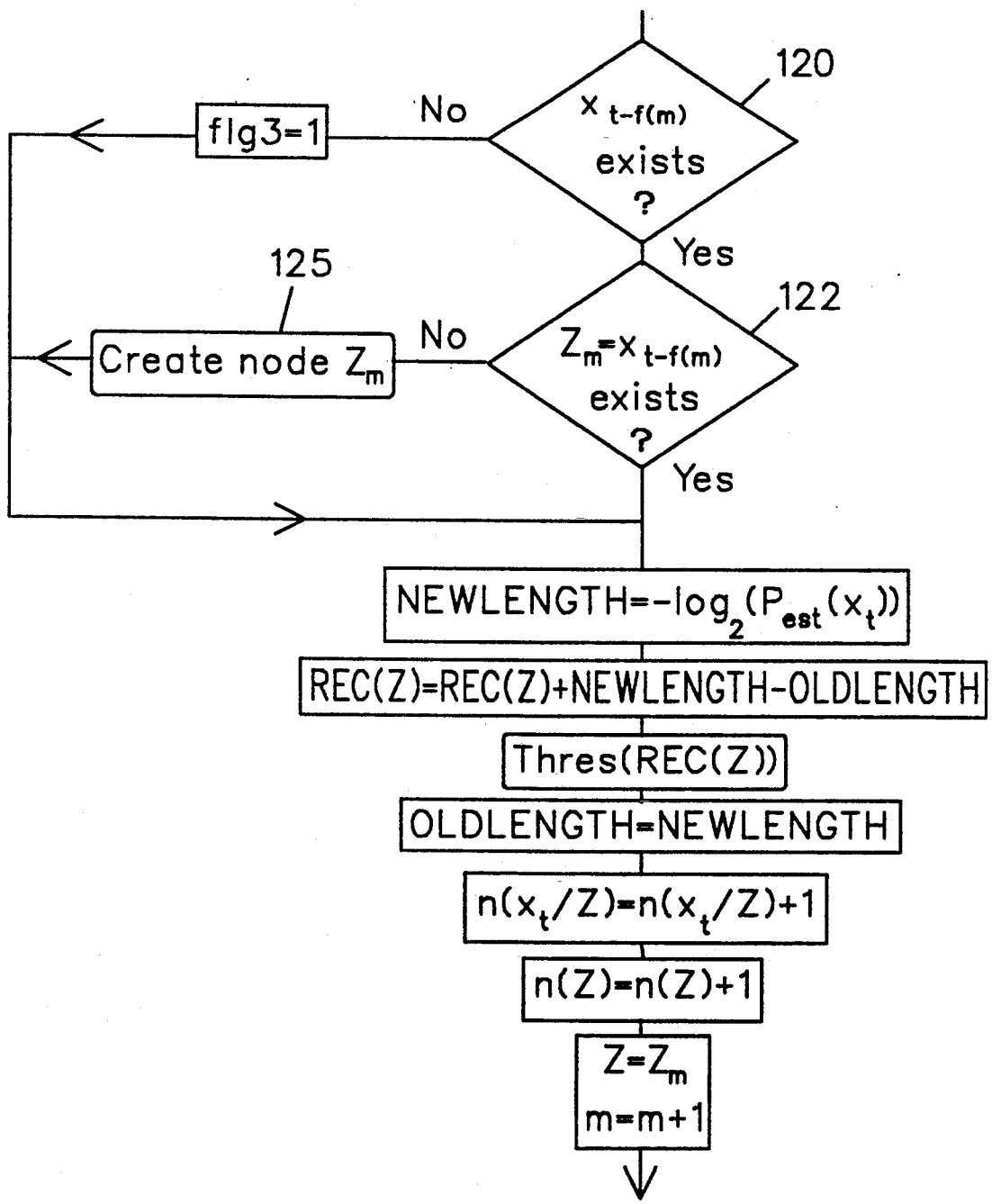
Figure 13:
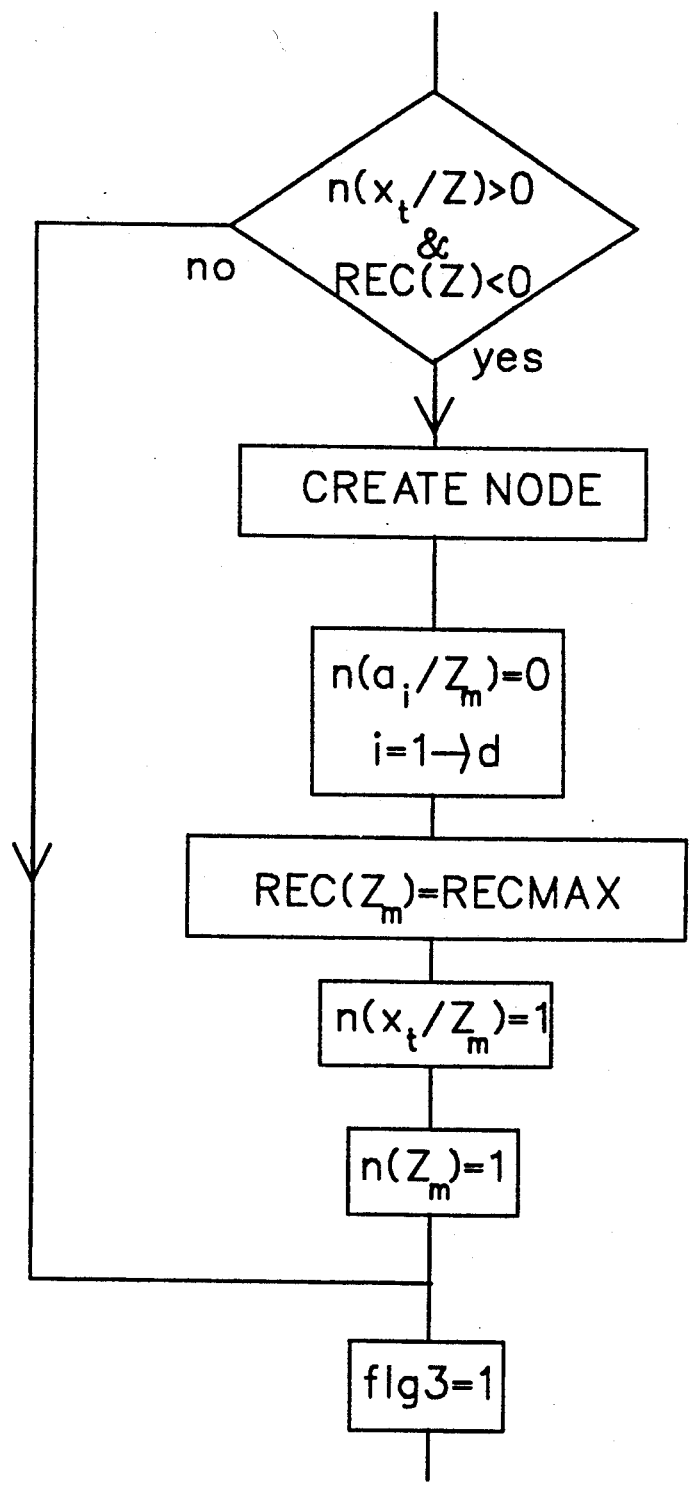

Similarly also, $x_t$ count and total count within node Z are incremented. Then the decoding scheduler routine branches to the tree development routine RMM of FIG. 12. Again, both symbol existence and node existence are being tested (see 120 and 122) with the latter test failure leading to a node creation routine 125, as represented in FIG. 13. This routine operates like the routine of FIG. 4 did. In other words, both node creation routines to extend the transmitter (coder) and receiver (decoder) trees are similar to each other.

To further help fully understanding the operation of this invention, the coding of a string of twelve characters (i.e.: ABABABABABAB) taken within a family of d=3 characters (i.e. a$_1$=A ; a$_2$=B a$_3$=C) is described hereunder. To help the tree grow faster and add to the illustrative significance of the selected example RECMAX and RECMIN values have been selected to be respectively equal to+1 and −1, rather than+5 and −5 that one should rather select in practice.

$$\text{Also, since } d = 3,\ \text{Pest} = \frac{n(x_t/Z) + 1}{n(Z) + 3}$$

Calling TRANSINIT routine sets the parameters to look as follows:
OL=
Pest=
NL
REC=−1
(NB: OL and NL stand for OLDLENTGH and NEWLENGTH respectively)

The tree is limited to a root node with all counts at zero.

Time index t=1. The Modelling process starts with inputting first symbol ("A"). Since no symbol was already processed, the answer to test 31 of the TMM routine would be negative. The flag flg(3) is set to 1 to enable further checking TMM operation completion, i.e.: optimal node chosen, encoding operated as well as tree updating and development performed.

TTRANS routine is executed. In other words, arithmetic encoding of first "A" is performed based on a tree limited to a root node bearing all counts initially at zero.

A flag flg(2) setting is used to check during further process, whether said encoding was already performed.

The root counts are then updated to include OLDLENGTH=32;

$$Pest = \frac{0+1}{0+3} = 1/3$$

NEWLENGTH = $-\log_2(\frac{1}{3})$ = 1.58
REC = $-1$

Subsequently, the A counter within the root is incremented. This leads to the Modelling Unit building a tree limited to the root and looking as follows.

Since flg3=1, the scheduler branches out of TMM routine.

Step 1: "A" ; time:index t=1:

```
Symbol = A
A, B, C        OL = 32
*(1, 0, 0)     Pest = 1/3
               NL = 1.58
               REC = -1
```

The root is the optimal node to be selected for encoding the current symbol "A".

Step 2: A "B" ; time index t=2:

Nex$_t$, symbol $x_2$=B is inputted.

As already mentioned, f has been chosen as being the identity function for processing printed characters. $x_{t-f(1)} = x_{t-1} = x_1 = A$. The answer to test (31) of TMM routine is positive since a symbol was already processed. Test (32) is negative. Then TCN is called, but no node creation, because test (40) failed flg3=1. Then, the TTRANS routine is executed based on a single root node tree bearing counts (1, 0, 0). The counts are updated and stop.

Obviously, the root is then again the optimal node selected for encoding the current symbol B.

```
Symbol = B
A, B, C        OL = 32
*(1, 1, 0)     Pest = 1/4
               NL = 2
               REC = -1
```

Step 3: AB "A":

Again, flg3=1 branches the scheduler to call next symbol processing starting back from root node.

Inputted symbol is now $x_t$=A. The answer to TMM test (31) is positive, since a symbol already existed in the string of past symbols being processed. The routine switches then to test (32) looking for a first node z1=$x_{t-1}$=B. No other node than the root exists and therefore the answer to test (32) is negative. The routine branches to (33) (node creation) of FIG. 4. Test 40 is performed to check compliance of the above tree arrangement with double condition n(A/Z) >0 and REC(Z) <0. The currently considered node (i.e. the root) A count is equal to 1 and REC(node)= −1. Both conditions are met. A new (son to the root) node (i.e. "B" node) is created bearing all counts set to zero and REC(B) is set to RECMAX=1. Then both root and just created B node counts are updated and the flag flg(3) is set to 1.

The tree is thus extended and updated to look as follows:

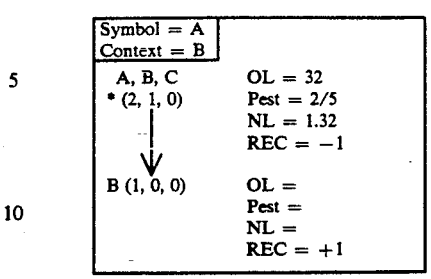

One should notice that since arithmetic encoding should be performed, for each new inputted symbol, based on the actual context, the computation parameters are set prior to incrementing the counts. therefore, $$Pest = \frac{n(x_t/Z) + 1}{n(Z) + 3}$$

leads to a root Pest computed to be:

$$Pest = \frac{n(A/root) + 1}{n(root) + 3} = \frac{2}{5}$$

Flag flg3 is set to one, calling the next symbol and branching back to the root.

Step 4: ABA "B"

Inputted symbol is $x_t$=B Again, the answer to TMM test 31 is positive and the routine switches to test (32) looking for z1=$x_{t-1}$=A "son" node to the root. No such son node existing, the routine switches again to function of FIG. 4. Since n(B/root)=1>0 and REC(root)= −1<0, and "A" son node is created, with all counts initially set to zero and a REC(A)=1.

Then, both the root and the just created "A" node counts are updated and flg.3 is set to 1.

The tree is therefore made to look as follows:

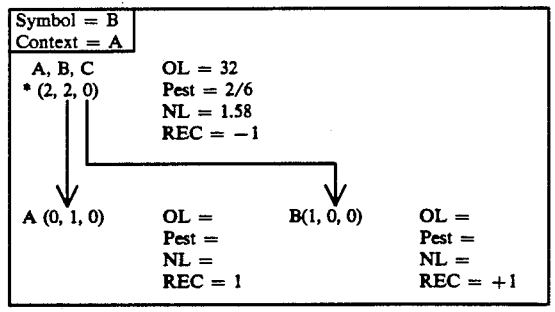

Again, flg.3 test switches the scheduler routine back to calling a new symbol.

Step 5: ABAB "A" ; z=$x_{t-1}$=B

The answers to both tests (31) and (32) are positive. The routine branches to testing REC (Zm=B). Since REC(B) is positive, operations TTRANS are performed for arithmetic encoding.

Once the TMM routine is executed, the tree looks as follows:

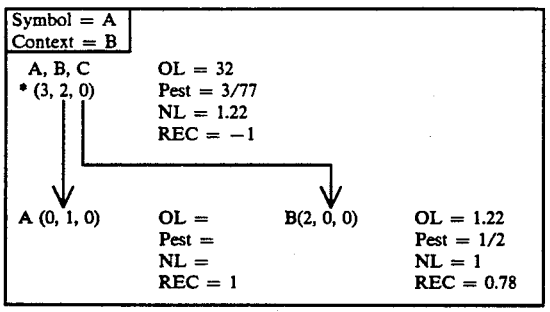

It should be noticed that the son (B) node OL is set to the father's node (root) NL.

The system proceeds then further with the following steps generating the tree evolutions as indicated hereunder.

Step 6: ABA:ABABA "B":

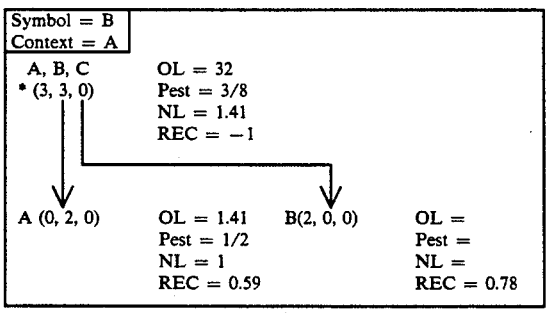

Step (7: ABABAB "A"

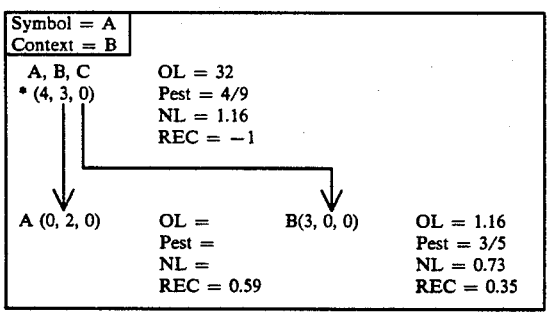

Step (8: ABABABA "B"

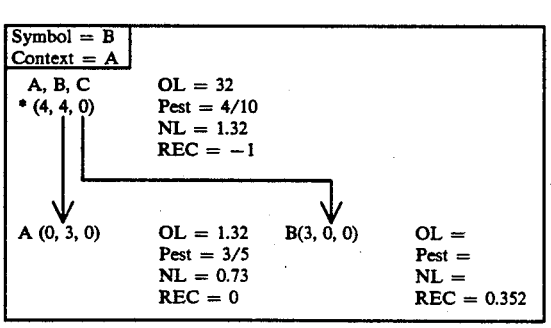

Step 9: ABABABAB "A"

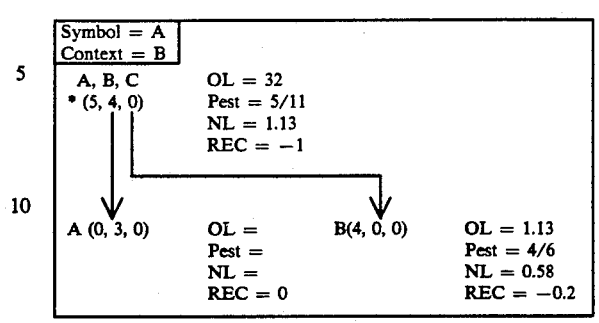

Step 10L ABABABABA "B"

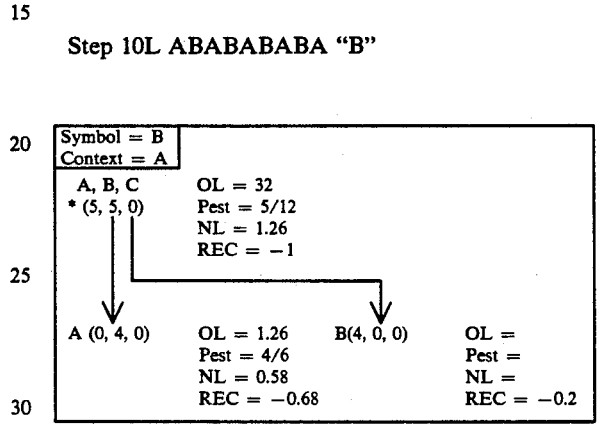

Step 11: ABABABABAB "A"

This step should lead to further extension of the context which might be of interest to consider.

The scheduler sets $t=11$; $Z=$root; $m=0$; flg.2=0; flg3=0 and OL=32, leading to TMM routine.

$m=m+1=1$; $x_{t-1}=x_{10}$ (tenth processed symbol of the considered string) leads to a positive test (31).

$zm=x_{10}=B$. Since a node B exists, test (34) is performed.

REC(B) being negative, test (34) is positive. The root node parameters (including counts) are updated. $Z=zm=B$ branches the current node (*) to be node B. Node B is changed from "son" node to "parent" node. Since flg3=0, TMM is again operated.

$m=m+1=2$; $x_{t-x}=x_9=A$, leads to test (31) positive, but test (32) fails since no "A" "son" node to current node "B" exists. The routine branches to node creation routine (33). Test (40) leads to $$n(x_t/Z)=n(a/\text{node B})=4>0$$

$$\text{AND REC}(Z)=\text{REC(node B)}=-0.2<0$$

Therefore, an "A" son node is created with all counts set to zero. Then REC(A)=RECMAX=1, the A count of son node A is set to one and flg3=1. The current node (i.e. parent node B) parameters are updated and TMM stops due to flg3=1. The tree looks then as follows and a new symbol is called.

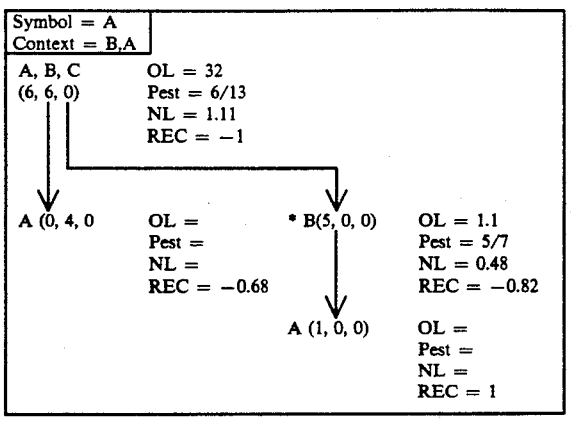

Step 12: ABABABABABA "B"

Last symbol processing starts with scheduler setting $t=12$; $Z=$root; $m=0$; flg2; flg3$=0$ and OL$=32$, and then branching to TMM routine execution.

$m=m+1=1$ $x_{t-1}=x_{11}$ leads to test (31) positive $zm=x_{11}=A$

Node A exists. Therefore test (34) is performed. REC(A) being negative, test (34) leads to node parameters updating. Then $Z=zm=A$ leads to current node (*) to now be currently processed node "A". Since flg3$=0$, TMM routine is executed.

$m=m+1=2$ $x_{t-2}=x_{10}=B$ leads to a positive test (31).

Test (32) fails since no son node B to current node A exists. The routine branches again to node creation (33).

$n(x_t/Z)=n$ (B/current node A)$=5>0$

AND REC (current node A)$=-1<0$

A "B" node, son to current node A is created. The tree looks now:

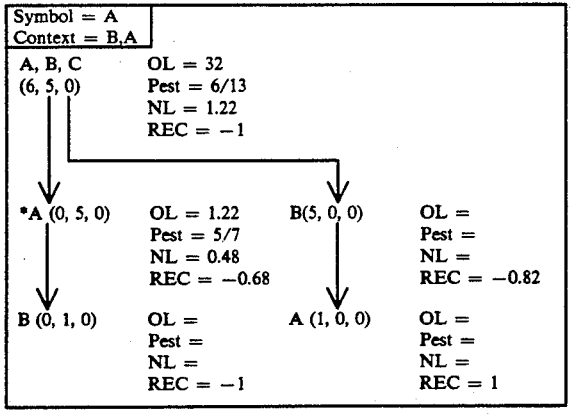

TMM stops since flg3$=1$. The whole process also stops.

It should be noted that while developing the Modelling Unit process controlled by the scheduler routine as described above, the TTRANS routine executed the Arithmetic Encoding operations by feeding the Encoding Unit (64) accordingly.

As already mentioned, said Arithmetic Encoding, implemented as disclosed in the above referenced patent, generates the encoded bit string c(s) once fed at each TTRANS routine run with:

$d=3$ $n'(z)=n'(A/Z)+n'(C/Z)$ $Q(x_t)=n'(1/Z)+\ldots+n'(x_t/Z)$ $Q(d)=n'(1/Z)+\ldots+n(d-1/Z)$ $n'(x_t/Z)=$individual count of current symbol at the coding node Z.

with the cumulative counts $Q(x_t)$ and $Q(d)$ being computed on reordered counts as already mentioned.

I claim:

1. An improved coding method for adaptively encoding a flow of data symbols $x(t)=x_1, x_2, \ldots, x_t$ taken within a "d" long symbol family, into a compressed bit string c(s), said method including so-called modelling operations whereby the number of times or counts each symbol of the flow occurs, is collected in a tree architecture denoting past symbols of the flow considered in a predefined order according to a reordering context function f(t), said tree including at least one node (root) from which tree branches might be derived, said method being characterized by:

providing each node with:
"d" symbol counters respectively assigned to each symbol of the family and to be selectively incremented according symbol occurrences within the flow being currently processed;
a Relative Efficiency Counter (REC) to store the considered node efficiency, i.e. so-called difference of coding length, to coding versus parent node;

reading sequentially the flow of symbols;
searching for each currently considered symbol xt the optimal coding node, by climbing the tree and visiting successive nodes, based on said predefined order consideration, and up to an optimal coding node being the first decreasing REC node preceding a node with an increasing REC;
coding $x_t$ by feeding a so-called arithmetic coding device with the optimal node counts;
updating the visited node counts and extending the tree from the coding node.

2. An improved coding method according to claim 1, wherein said tree extension is subject to the double condition of current symbol count positive and decreasing REC being satisfied within said coding node.

3. An improved coding method according to claim 1 or 2, wherein said coding length is measured at any visited node Z(j) for current symbol $x_t$ through a so-called entropy measurement $E(x_t/Z(j))=-\log(\text{Pest } x_t)$ wherein, $$\text{Pest}(x_t) = \frac{n(x_t/Z(j)) + 1}{n(Z(j)) + d}$$

wherein $n(x_t/Z(j))$ is the $Z(j)$ node count of symbols identical to $x_t$, and $Z(j)$ the sum of said node counts.

4. An improved coding method according to claim 1 or 2 wherein said symbols are printed characters.

5. An improved coding method according to claim 1 or 2 wherein said symbols are image pixels.

6. An improved coding method according to claim 4, wherein said reordering context function is the so-called identity function whereby $f(t) = 1, 2, 3, \ldots$.

7. An improved coding method according to claim 1 or 2 wherein said node efficiency to coding is tracked through REC derivative sign.

8. An improved coding method according to any one of claim 1 or 2, wherein said node efficiency to coding is tracked through a thresholded REC variation contents.

9. An improved coding method according to claim 7, wherein said optimal coding node search for each current $x_t$, includes:

searching whether said current symbol existed in the flow of past symbols considered in accordance with said reordering context function f(t), and should the answer to such symbo) searching test be negative, then performing the arithmetic coding operations prior to updating and extending the tree, otherwise, should the symbol searching test be positive, searching, through a so-called node existence test, whether an $x_t$ labelled node existed, and, in case of negative node existence test, switching to node creation operations, or otherwise, should the node existence test be positive, testing for REC variation, up to first decreasing REC node preceding an increasing REC node, said node being then considered as the optimal coding node looked for.

10. A decoding method for decoding a bit string c(s) obtained by coding a flow of symbols according to 1 or 2, said decoding method including processing each decoded symbol for the so-called tree modelling operations for optimal decoding node detection through relative REC sign variation.

11. A device for adaptively encoding a flow of symbols $x(t) = x_1, x_2, \ldots, x_t$ individually taken within a "d" long symbol family, into a compressed bit string c(s), said device including a so-called Modelling Unit for performing modelling operations whereby the number of times each symbol of the considered flow of symbols occurs, is collected in a tree architecture denoting past symbols of the flow considered in a predetermined order according to a reordering context function f(t), said tree including at least one node (root) from which tree branches would be derived while feeding the successive symbols $x_t$, said Modelling Unit feeding an Encoding Unit using so-called arithmetic coding techniques, said device being characterized in that said Modelling Unit includes:

scheduler means for sequentially inputting the current symbol $x_t$ to be encoded;

Model Managing means sensitive to said scheduler means and including:

means for assigning each generated tree node with "d" individual counting means and a so-called Relative Efficiency Counter (REC);

testing means for testing existing tree architecture versus current symbol $x_t$, starting with the root node and visiting selected nodes;

optimal coding node detection means sensitive to said testing means for detecting a so-called optimal coding node based on node REC variation testing.

12. A device according to claim 11, wherein said Modelling Unit further includes means sensitive to the optimal node individual counts and current symbol $x_t$, for providing the Arithmetic Coding Unit with the required parameters including individual and cumulative counts.

13. A device according to claim 11 or 12, wherein said optimal coding node detection means include means for detecting first visited node bearing a decreasing REC and followed by a node bearing an increasing REC.

14. A device according to claim 13, wherein said testing means include symbol identifying means for identifying processed symbols considered in a reordered arrangement according to a predefined reordering function f(t);

symbol existence testing means sensitive to said identified symbol for testing existence of said identified symbol within past processed symbols;

node existence testing means sensitive to said symbol testing means and to said symbol identifying means for testing the existence, within the current tree architecture, of a so-called son node as defined by said identified symbol; and, tree extension means including tree extension means including:

node count sign testing means;

REC variation checking means;

whereby the considered tree is being extended through generation of a son node should said node count tested be positive and said REC be decreasing.

15. A device according to claim 14, including REC thresholding means, whereby decreasing REC is being tested through thresholded REC sign test.

16. A device according to claim 14, including REC derivative means, whereby decreasing nvc is being tested through nvc derivative sign.

* * * * *